United States Patent [19]

Marcinkiewicz et al.

[11] Patent Number: 5,422,513
[45] Date of Patent: Jun. 6, 1995

[54] INTEGRATED CIRCUIT CHIP PLACEMENT IN A HIGH DENSITY INTERCONNECT STRUCTURE

[75] Inventors: Walter M. Marcinkiewicz; Raymond A. Fillion, both of Niskayuna; Barry S. Whitmore, Utica; Robert J. Wojnarowski, Ballston Lake, all of N.Y.

[73] Assignee: Martin Marietta Corporation, Bethesda, Md.

[21] Appl. No.: 329,516

[22] Filed: Oct. 4, 1993

Related U.S. Application Data

[63] Continuation of Ser. No. 962,449, Oct. 16, 1992, abandoned.

[51] Int. Cl.[6] ............... H01L 23/485; H01L 29/44; H01L 29/52; H01L 29/60
[52] U.S. Cl. .................... 257/668; 257/676; 257/700; 257/721; 257/725; 257/707; 257/711; 257/758
[58] Field of Search ............. 257/666, 671, 676, 677, 257/668, 669, 685, 697, 700, 702, 703, 721, 725, 735, 783, 786, 788, 792, 793, 708, 742, 707, 711, 758, 728, 776

[56] References Cited

U.S. PATENT DOCUMENTS

| | | | |
|---|---|---|---|
| 3,591,838 | 7/1971 | Fujiwara et al. | 257/742 |
| 3,903,590 | 9/1975 | Yokogawa | 257/708 |
| 4,714,516 | 12/1987 | Eichelberger et al. | 156/628 |
| 4,783,695 | 11/1988 | Eichelberger et al. | 257/725 |
| 4,835,704 | 5/1989 | Eichelberger et al. | 364/490 |
| 4,878,991 | 11/1989 | Eichelberger et al. | 156/630 |
| 4,894,115 | 1/1990 | Eichelberger et al. | 156/643 |
| 4,933,042 | 6/1990 | Eichelberger et al. | 156/239 |
| 5,047,834 | 9/1991 | Kovac et al. | 257/735 |
| 5,111,278 | 5/1992 | Eichelberger | 257/725 |
| 5,154,793 | 10/1992 | Wojnarowski et al. | 156/344 |

*Primary Examiner*—Jerome Jackson
*Assistant Examiner*—Alice W. Tang
*Attorney, Agent, or Firm*—Geoffrey H. Krauss

[57] ABSTRACT

A high density interconnect (HDI) structure having a dielectric multi-layer interconnect structure on a substrate is fabricated by forming a chip well, placing a chip in the well, and connecting the chip to the interconnect structure. Additionally, temperature sensitive chips or devices may be located beneath the dielectric multi-layer interconnect structure. A spacer die may be located in the substrate while the interconnect structure is fabricated and removed after a chip well aligned with the spacer die is formed, in order to accommodate a chip thickness which is greater than the dielectric multi-layer interconnect structure thickness.

8 Claims, 4 Drawing Sheets

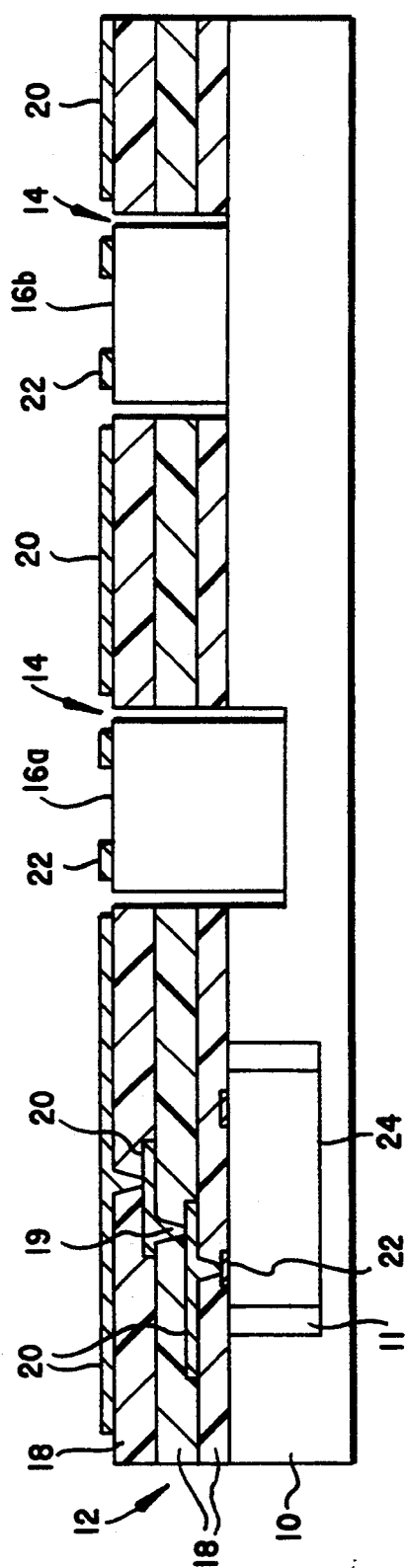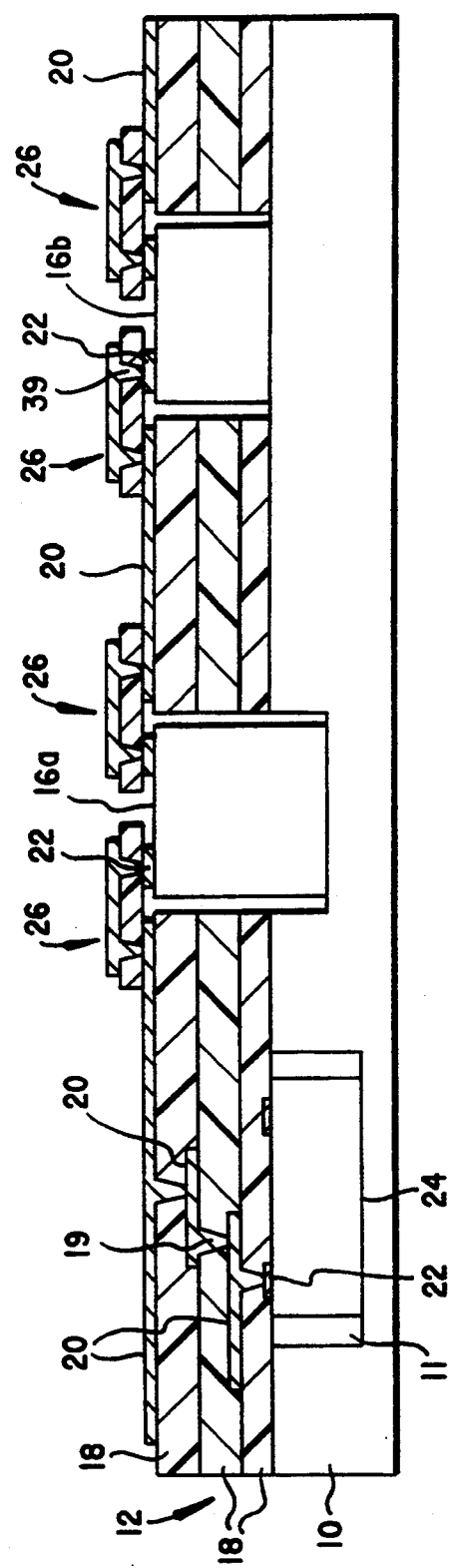

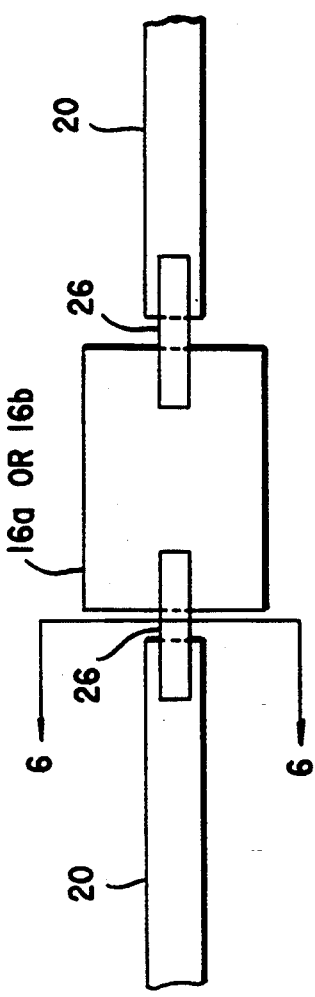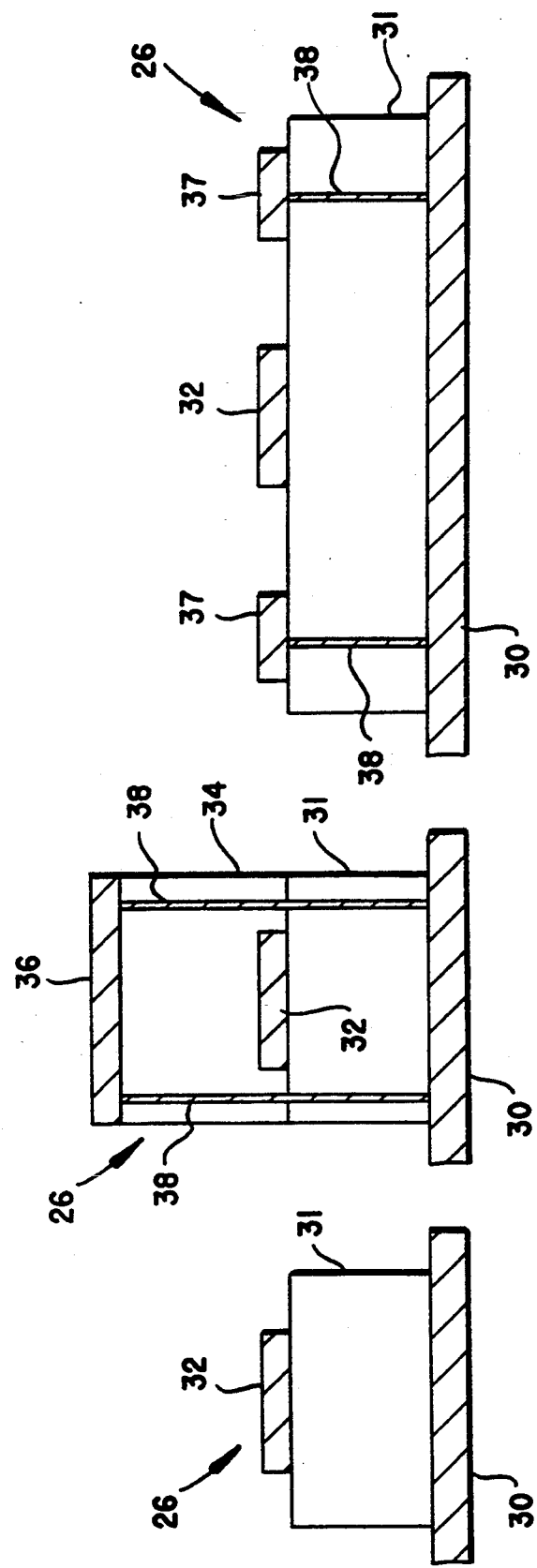

INTEGRATED CIRCUIT CHIP PLACEMENT IN A HIGH DENSITY INTERCONNECT STRUCTURE

This application is a continuation of U.S. application Ser. No. 07/962,449, filed Oct. 16, 1992, abandoned.

CROSS-REFERENCE TO RELATED APPLICATIONS

This application is related to the following co-pending applications which are assigned to a common assignee and are incorporated herein by reference: Thinning of Integrated Circuit Chips for Lightweight Packaged Electronic Systems and Systems Resulting Therefrom, U.S. Ser. No. 07/962,379 by R. J. Wojnarowski, filed concurrently herewith;

"Wafer Level Integration and Testing", U.S. Ser. No. 07/962,000 by R. J. Wojnarowski et al., filed concurrently herewith.

BACKGROUND OF THE INVENTION

1. Field of the Invention

This invention is generally directed to an integrated circuit packaging configuration. More particularly, the invention relates to a high density interconnect structure and method for fabrication in which portions of dielectric or other materials are removed to create space for inserting an integrated circuit chip which may then be connected to the structure.

2. Description of the Related Art

In the packaging of very large scale integrated circuit devices, much space is taken up by mechanisms for connecting one chip to an adjacent device. This makes the packaging of integrated circuit devices and electronic components thereon larger than necessary. However, efforts expended in further developing these processes to further shrink the packaging have generally resulted in limited yield. Because a number of chips or dies on a wafer are often found to be defective, the number of wafers produced that are completely usable is generally lower than desired. Furthermore, there still exists the problem of interconnecting the chips of varying technologies on a single wafer. Accordingly, it would be very desirable to construct wafer scale integrated circuit packages using individual, easily testable integrated circuit chips. It is to this end that the invention is directed.

High density interconnect (HDI) techniques use a film overlay which covers a plurality of integrated circuit chips adjacent to one another on an underlying substrate. The polymer film provides an insulated layer upon which is deposited a metallization pattern for interconnection of individual circuit chips. A significant advantage of the HDI technique is the ability to remove one or more of these interconnection layers so as to provide a multitude of arrangement and testing capabilities.

Methods for carrying out a multi-layer interconnect process using an overlay approach are described in commonly assigned U.S. Pat. No. 4,783,695, issued Nov. 8, 1988, and in commonly assigned U.S. Pat. No. 4,933,042, issued Jun. 12, 1990, both of which are hereby incorporated by reference.

It is desirable to provide via openings or apertures in the polymer dielectric layer so as to be able to provide electrical connection between various parts of a chip or between several chips. Commonly assigned U.S. Pat. No. 4,894,115, issued Jan. 16, 1990, and commonly assigned U.S. Pat. No. 4,714,516, issued Dec. 22, 1987, which disclose embodiments for providing such apertures, are also hereby incorporated herein by reference.

Methods for gaining access to and replacing a defective integrated circuit chip are disclosed in commonly assigned U.S. Pat. No. 4,878,991, issued Nov. 7, 1989, which is also hereby incorporated by reference.

Future large volume module manufacturing requires further improvements in the existing process in several key areas including yield enhancement, cost reduction, and repairability. Mixed technologies of different materials such as Si and GaAs are difficult to integrate. Also, different chip suppliers sell chips of various dimensions with some thicknesses being in the 4 mil range and others in the 20 mil range. Rework of sensitive components is difficult and results in a higher cost integrated circuit package.

In HDI, polymers on sensitive chips decrease chip performance, so to keep their performance from degrading, ablation or removal of the dielectric overlay covering high frequency chips, electro-optical devices, or sensor chips is necessary. This step is very complicated and time consuming. Additionally, it creates a risk of degrading chip integrity and performance. Also, under conventional practices, the transition area from the edge of the milled pocket to the chip introduces a coupling of air and dielectric overlay which creates an impedance transition at radio frequencies that is difficult to characterize.

SUMMARY OF THE INVENTION

One object of the invention is to provide a means of supplying a known channelled and controlled impedance line from the overlay in a high density interconnect structure to a chip in that structure.

Another object of the invention is to eliminate, or at least reduce, ablation of the overlay on top of chips that perform better with an air dielectric in an HDI structure.

Yet another object of the invention is to reduce the cost of an HDI module by not having to mill out pockets for thin chips being integrated after the interconnect module has been assembled.

Still another object of the invention is to increase sensitive chip integrity by not subjecting it to the HDI process temperatures, and thus allow higher process temperatures in fabricating an HDI structure.

A still further object of the invention is to provide an interconnect set-up for an HDI structure which allows removal of a chip and connector therefrom while leaving intact the interconnections on the other good chips and the base material of the structure.

Yet another object of the invention is to provide a method to multi temperature process an HDI assembly for visual sensor applications.

Still another object of the invention is to provide an HDI structure which can accommodate varying thicknesses for chips with a short aspect ratio of interconnect to chip thickness.

Briefly, according to the invention, an integrated circuit package comprises a substrate with a dielectric module containing a chip well therein. The dielectric module comprises a plurality of dielectric layers with at least one layer having disposed thereon a plurality of metal interconnects. A last chip including interconnection pads is disposed in the chip well. The word "last" is used to distinguish chips inserted after the dielectric layers and plurality of metal interconnects have been applied with other, optional "first" chips which may have been inserted before the dielectric layers and metal interconnects. Connection means for connecting one of the interconnection pads with one of the plurality of metal interconnects in a circuit is present.

In another embodiment, a method for fabricating an integrated circuit package is disclosed. First, a plurality of dielectric layers is applied on a substrate while disposing a plurality of metal interconnects on at least one of the layers. Second, a chip well is provided in or through the plurality of dielectric layers. Third, a last chip including interconnection pads is disposed in the chip well. Finally, connection means for connecting one of the interconnection pads with one of the plurality of metal interconnects in a circuit is provided.

In another embodiment, a method of ensuring operability of an integrated circuit package including a substrate and a first chip supported by the substrate is provided. First, a plurality of dielectric layers with a plurality of electrical conducting interconnects making contact to the chip on at least one of the plurality of dielectric layers is provided. Then, the first chip is tested by applying test signals to the plurality of electrical conducting interconnects.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, with like numerals throughout the drawings representing like components throughout the drawings, in which:

FIG. 3 is a view similar to that of FIG. 2, with the addition of last chips in the chip wells;

FIG. 4 is a view similar to that of FIG. 3, with the addition of flexible interconnect structures for interconnecting the last chips to the dielectric module;

FIG. 5 is a top view of a portion of the structure of FIG. 4 illustrating the placement of a flexible interconnect structure;

FIGS. 6a, 6b, and 6c are additional sectional views taken along line 6—6 of FIG. 5, further illustrating various alternative embodiments of FIG. 4 and FIG. 5.

DETAILED DESCRIPTION OF A PREFERRED EMBODIMENT OF THE INVENTION

Figure 1:
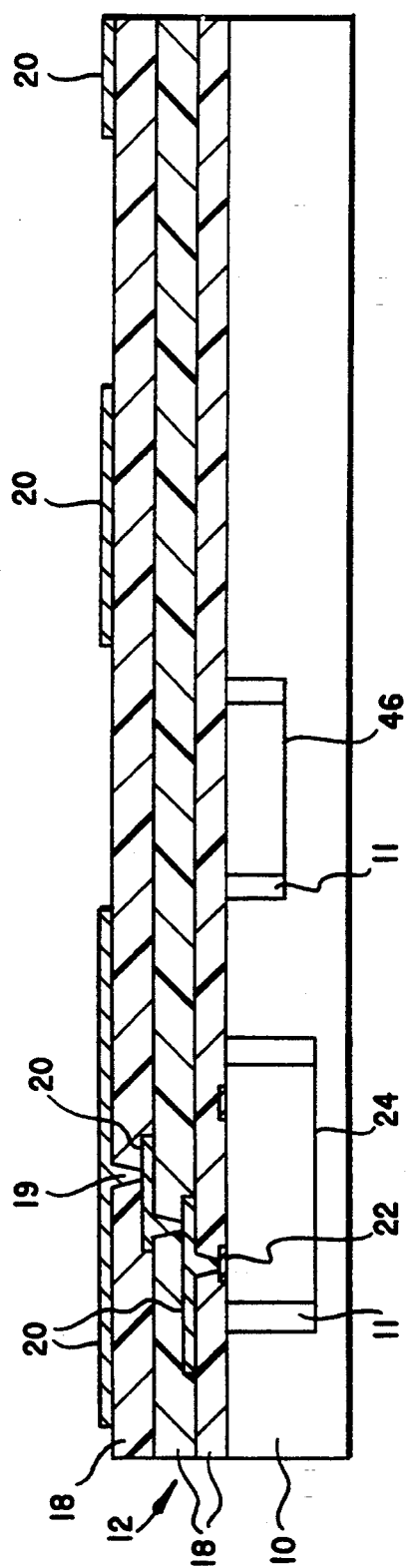
FIG. 1 is a sectional side view of a module including dielectric layers affixed to a substrate containing a first chip and a spacer die.

FIG. 1 illustrates a sectional side view of a dielectric module 12 comprising a substrate 10 containing an optional first chip 24 and an optional spacer die 46. In a preferred embodiment, any milling of substrate 10 will involve creating pockets 11 only for passive components and all chips which are approximately greater than five mils in thickness. A spacer die insert 46 may be used to allow conventional construction of dielectric module 12 and be removed after chip wells 14 have been formed (as discussed with respect to FIG. 2) to allow chips 16a, shown in FIG. 3, with greater thickness than the dielectric module, to be inserted. No milling will be required, for example, for chips 16b, shown in FIG. 3, which are approximately four mils thick. It is unnecessary to mill out pockets for these chips because their respective top surfaces will be approximately level with the top surface of the high density interconnect overlay, as shown in FIG. 3.

A dielectric module is made up of a plurality of dielectric layers 18 with one or more metal interconnects 20 arranged on at least one layer. The number of dielectric layers 18 and the placement of metal interconnects 20 shown herein are merely examples; there may be different numbers of layers and different metal interconnects.

The multi-layer dielectric structure can be fabricated using lamination, spin, or spray coating, and it may have a thickness sufficient to accommodate at least one last chip 16b (see FIG. 3). Spin or spray coating may be done by conventional methods. Spin coating involves placing a puddle on a substrate and spinning the substrate so that the puddle spreads across the substrate. Spray coating involves spraying the layer directly on the substrate. Both spin and spray coating typically result in thinner dielectric layers than lamination coating. The preferred method of lamination coating is achieved by disposing dielectric layer 18 over substrate 10 or other dielectrics 18 in close proximity to them but not in substantial contact; applying vacuum conditions above and below the dielectric layer so as to maintain the non-contact condition; heating the dielectric under vacuum conditions; and then applying fluid pressure above the dielectric layer so as to move it into contact with the structure. This process is disclosed in U.S. Pat. No. 4,933,042, which also discusses several other approaches: roll lamination in which a structure is passed between two heated rollers and the pinching effect of the rollers, combined with heat, laminates the film to the substrate; use of a vacuum bag and oven; and press lamination in which the material to be laminated is placed between two heated platens which are forced together by means such as hydraulically applied pressure. In each of the various techniques, the substrate (or structure that the layer is being added to) may be pre-coated with an adhesive. Suitable adhesives include, but are not limited to, thermoplastic, thermoset, and ultraviolet curable adhesives. Alternatively, a thermoplastic film can be laminated directly.

Vias 19 are aligned with at least one of the metal interconnects 20. Preferably the alignment is performed such that the opening is perpendicular to the substrate plane; however, the alignment may also be slanted or made by any other configuration which provides for a connection between the top dielectric layer and an interconnection pad or metal interconnect. There are several methods for this process. The preferred method, as disclosed in U.S. Pat. No. 4,894,115, is to repeatedly scan the dielectric layer with a laser and to then perform a short plasma etch. Additionally, a method of providing holes in a dielectric without use of a mask is disclosed in U.S. Pat. No. 4,714,516 which includes steps of irradiating an area on the film with a burst of focused laser energy at a level sufficient to damage the film without puncturing it and then plasma etching the irradiated film so as to remove the damaged portions.

Metal interconnects 20 are fabricated with appropriate metallization techniques. The interconnects may be fabricated in any pattern suitable for the particular application required. In one embodiment, metallization is preferably applied by first using a plasma discharge to clean the surface of the area to be metallized. After cleaning, a buffer layer of metallization, such as titanium or chromium, is applied by direct sputtering to cover the entire surface of the dielectric layer. Then a layer of copper is deposited directly on the titanium or chromium deposit by a combination of sputtering and electroplating. Optionally, a second buffer layer is then deposited directly on the copper layer. After completion of the metal deposition, a layer of photoresist is deposited on the surface of the metal by spraying, spinning, or electroplating. U.S. Pat. No. 4,783,695 describes a metallization process and discloses the use of a contact mask for exposing the layer of photoresist. A preferred alternative to a contact mask is disclosed in commonly assigned U.S. Pat. No. 4,835,704, issued May 30, 1989, which describes an adaptive lithography system using direct writing laser lithography to expose the photoresist. U.S. Pat. No. 4,835,704 is hereby incorporated by reference.

After the photoresist has been exposed, it is developed and the structure is etched. As described in U.S. Pat. No. 4,783,695, preferably the optional top buffer layer is etched first, the copper layer is subsequently etched separately, and the buffer layer of metallization covering the dielectric layer is etched separately. Metal systems such as, for example, TiW gold or TiW aluminum, can alternatively be used instead of the titanium or chromium and copper combination that was discussed above.

Figure 2:
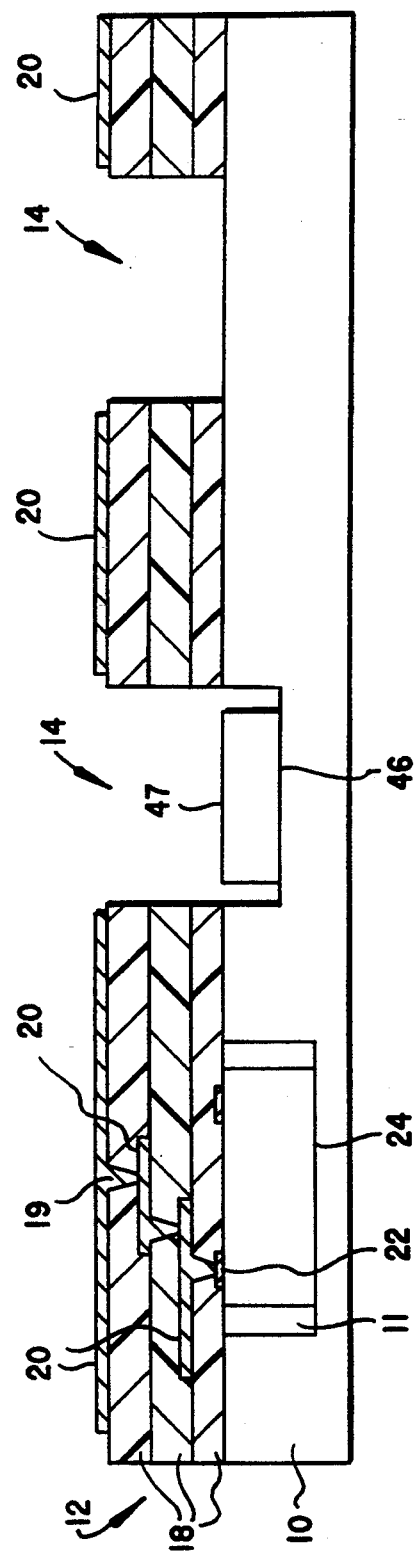
FIG. 2 is a view similar to that of FIG. 1, with the addition of chip wells inserted in the dielectric layers and exposing a spacer die and its well.

FIG. 2 is a view similar to that of FIG. 1 with the addition of chip wells 14. A chip well may be fabricated in any appropriate manner. Methods for removal of dielectric layers 18 can be either wet or dry, depending on process preference. The wet method involves using sodium hydroxide to etch out dielectric layers 18. This method may involve placing a mask on the dielectric module so that only the desired area or areas would be removed. Another example of a potential wet solution is methylene chloride. The preferred dry methods include excimer laser milling, RIE (reactive ion etching), barrel plasma ashing, and ion beam milling. Such methods are more refined than wet methods. Another option, if the dielectric layers were not thick enough to contain a chip such as chip 16a (shown in FIG. 3), would be to laser machine or mechanically mill out the desired cavity in the substrate.

An alternative to machining or milling out the cavity would be to use a spacer die 46, as shown in FIGS. 1 and 2, that is removed by any appropriate manner after the chip well ablation and before chip 16a (shown in FIG. 3) is inserted. Spacer die 46 may be constructed of silicon and need not have any electrical properties. Spacer die 46 may be removed, for example, by attaching a lifting member (not shown) to the exposed surface 47 (shown in FIG. 2) of the spacer. Any bonding layer material between the spacer die and the substrate should be chosen with a yielding temperature which is lower than the yielding temperature of the bond which may be used to attach the lifting member to the spacer die. Then the assembly is heated and the lifting member can pull the spacer die away while the temperature exceeds the yielding temperature of the substrate-spacer die adhesive but not the yielding temperature of the lifting member-spacer die adhesive. This process is further explained in allowed U.S. Application Ser. No. 07/644,716, filed Jan. 23, 1991, entitled "Method and Apparatus for Removing Components Bonded to a Substrate." Additional options for removal include using a laser or otherwise cutting out the spacer die.

Figure 7A:
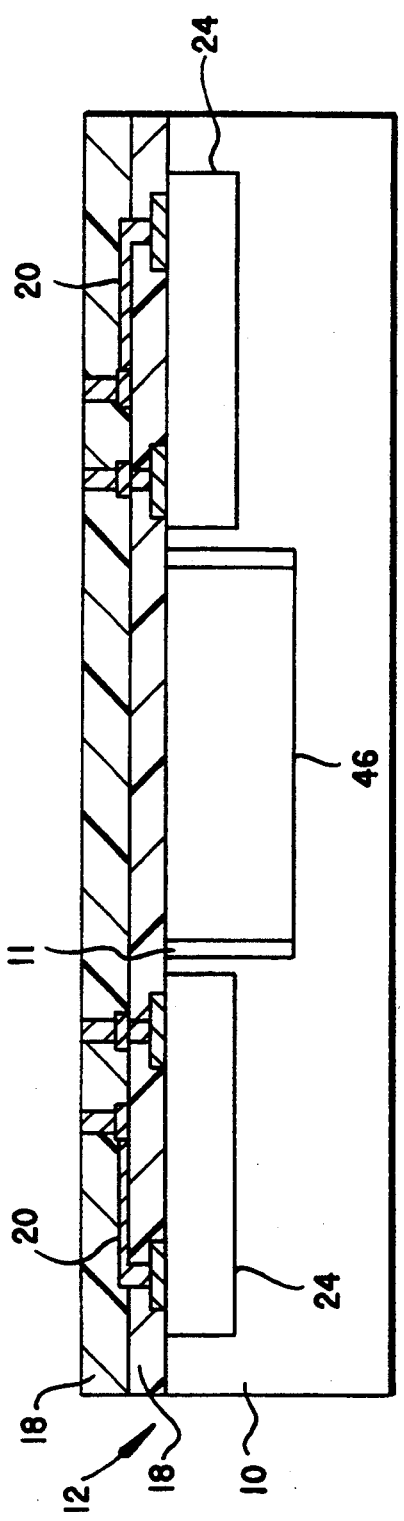
FIGS. 7a and 7b are sectional side views of structures similar to those shown in FIGS. 1 and 4, respectively, with the addition in FIG. 7b of a dielectric layer and connecting electrical conductor for interconnecting the chip to the module.
Figure 7B:
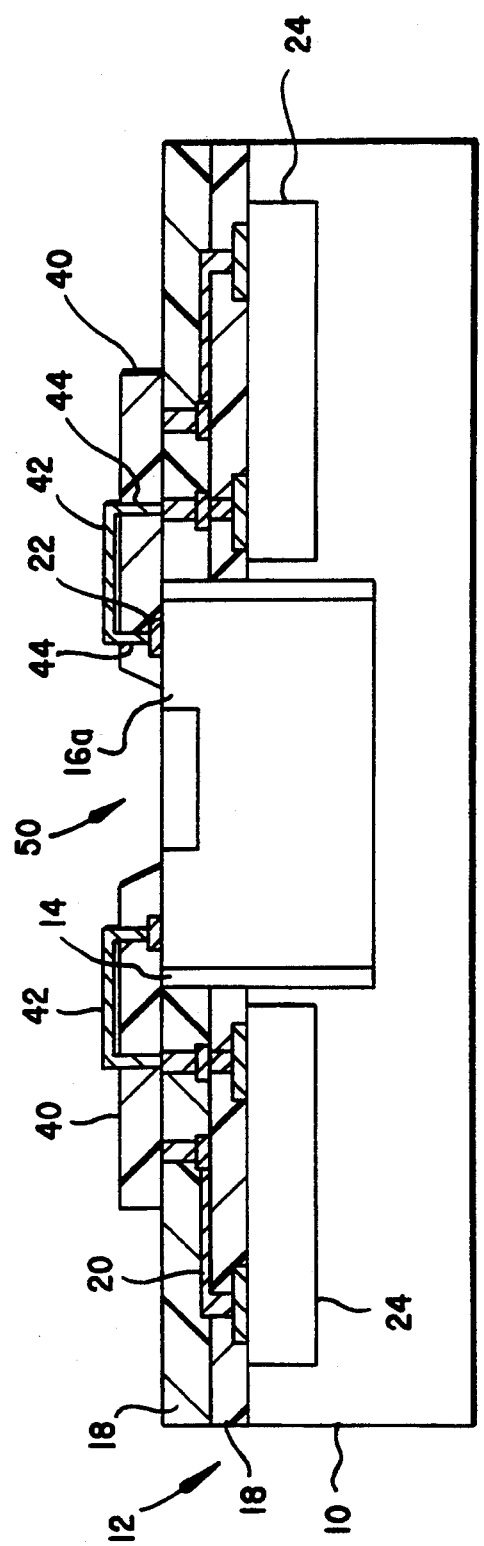

FIGS. 2, 7a and 7b (discussed below) show that a module can contain chips 24 (first chips) with interconnection pads 22 besides last chips 16a or 16b to be placed in the wells. This allows complete testing of a high density interconnect assembly prior to the insertion of temperature sensitive components (comprised of materials such as InSb and HgCdTe) which cannot withstand the normal high density interconnect temperatures. Additionally, such configurations may have visual sensor capability as an extension of the "smart" (flexible) skin approach discussed in commonly assigned R. J. Wojnarowski U.S. Application Ser. No. 07/962,379, filed concurrently herewith.

FIG. 3 is a view similar to that of FIG. 2 with the addition of last chips 16a and 16b with interconnection pads 22 in the chip wells. Chip 16a represents a chip with a thickness greater than that of the dielectric module, and chip 16b represents a chip with approximately the same thickness as the dielectric module. It is not necessary in the invention for both chips to be in the same module as pictured; the presence of either chip is within the scope of the invention. A chip may be an integrated circuit chip of any type or a stand alone component such as a capacitor. As previously noted, the word "last" is used to distinguish chips inserted after the high density module has been formed with other, optional "first" chips 24 which may have been inserted before dielectric layers 18 were applied. Thus, one embodiment would include "first" and "last" chips, whereas another embodiment would include only "last" chips. A chip may be placed in position in any appropriate manner.

Several methods of mounting are disclosed in U.S. Pat. No. 4,783,695: eutectic die bonding, epoxy die bonding, and thermoplastic die bonding. Thermoset die bonding is another alternative. At this stage of the process, the only processing that the last chips will undergo is the connection from the interconnect structure to the chip edge or bond pads.

FIG. 4 is a sectional side view and FIG. 5 is a partial top view showing the addition of a flexible interconnect structure 26 for interconnecting last chips 16a and 16b to dielectric module 12. The flexible interconnect structure can be a standard flexible circuit, flexible cable, TAB (tape automated bonding) structure, HDI assembly, or any derivative of these structures. The flexible interconnect structure may be designed in any appropriate manner, and may be optimized by stripline-like technologies for impedance matching. For example, one option is to construct the interconnect structure as employed in conventional high density interconnect modules. This can be done in advance or after last chips 16a and 16b have been inserted. An advantage to preparing the flexible interconnect structure in advance is that last chips 16a and 16b are not exposed to HDI processing.

FIGS. 6a, 6b, and 6c are sectional views taken along line 6—6 of FIG. 5 which show the position of the ground and dielectric layers of several potential configurations of the invention in greater detail. As shown in FIG. 6a, the flexible interconnect structure technology can provide a specifically designed (and thus known) impedance in a microstrip configuration using a metal strip 32 (which, through several vias 39, shown in FIG. 4, electrically interconnects the chip in the high density interconnect structure) located above, and separated from, a ground plane 30 by an insulating layer 31. Ground plane 30 may be deleted using a ground plane located below the chips 24, 16a or 16b or metal interconnects 20 (chips shown in FIG. 4 but not shown in FIGS. 6a, 6b, and 6c) to provide a ground reference plane with minor discontinuities due to chip-to-wall spacing. This may be compensated for by profiling the line for impedance matching. In the volume represented by insulating layer 31, there may be several layers of dielectrics and metal interconnects.

An additional option shown in FIG. 6b is a stripline configuration which is fabricated by applying a second insulating layer 34 on top of insulating layer 31 and metal strip 32 and applying a second ground plane 36 on top of second insulating layer 34. The second ground plane may be connected to the first ground plane with vias 38. The stripline configuration may result in more system loss than the microstrip configuration of FIG. 6a, but it provides better isolation and is thus preferable for use in harsh environments.

FIG. 6c illustrates another approach, a co-planar microstrip configuration in this embodiment, a second ground plane 37 is co-planar on insulating layer 31 with metal strip 32.

Attaching an existing flexible interconnect structure over the transition area from the high density interconnect overlay to last chip 16a or 16b creates a very controlled launch area (transition from the chip to the HDI structure) and is easily accomplished. Attaching the interconnect structure can be performed using the same technology as used in tape automated bonding. There are many varying approaches to such connections. A chip can be inserted with the flexible interconnect structure already attached. This prefabricated attachment may be accomplished by using a laser to weld a chip pad to the exposed portion of the metal strip, or by using a solder reflow ball and heating the solder with a directed laser or in an oven. Wire bonding may be used to connect both the chip and the metal interconnects, if desired. A thermosonic method involves touching the chip or metal interconnect with the exposed portion of the metal strip and then using heat and agitation to form a bond. A thermo-compression method involves heating the exposed portion of a metal strip and placing it in contact with the chip pad or metal interconnect and then pressing the two surfaces together until they bond.

These designs facilitate simple removal of last chip 16a or 16b by heating the connection to the dielectric and lifting the chip out of the well, in the same manner as discussed with respect to spacer die 46 in the configuration of FIG. 2, if it is not performing well either in a matched pair set-up or if it is functionally insufficient. These designs also allow dielectric layers 18 to remain on substrate 10 (shown in FIGS. 1 through 4) and thus prevent possible damage to the other good chips in the module.

FIGS. 7a and 7b are sectional side views of structures similar to those shown in FIGS. 1 and 4, respectively, with the assembling of the interconnect structure occurring after last chip 16a has been inserted. Although spacer die 46 is depicted in FIG. 7a and chip 16a is depicted in FIG. 7b, this technique would be equally applicable for thinner chips such as chip 16b (as shown in FIG. 4). After last chip 16a is placed in well 14, the connecting dielectric layer 40 (dielectric layer which will support the addition of pattern of interconnects 42 for connecting chip 16a to the metal interconnects 20) is laminated over chip 16a and module 12. Preferably, the connecting dielectric layer is comprised of a polymer film. The method for performing this lamination can be any of the techniques discussed with respect to FIG. 1.

Next, connecting vias 44 are formed and are aligned with at least one of interconnection pads 22 of chips 16a and at least one metal interconnect 20. This may be accomplished in the same matter as discussed with respect to FIG. 1.

Finally, a pattern of interconnects is fabricated. Pattern interconnections are made of electrical conductors 42 on the outermost dielectric that extend between some vias and connect selected interconnection pads in a circuit. At this point connecting vias 44 become conductive. The process for this fabrication can be the same as was discussed for the metal interconnects with respect to FIG. 1. The preferred method is adaptive lithography, because adaptive lithography can be used for both drilling the vias and patterning the interconnects.

After the interconnects are fabricated, large area ablation can optionally be performed over selected inserted chips, as illustrated in FIG. 7b by large area ablation 50 of chip 16a. This step would be desirable in high frequency and sensor applications. Moreover, these devices are often used in arrays that require precision placement. The use of connecting dielectric layer 40 and pattern of interconnects 42 allows such devices to be uniquely placed and interconnected by the high density interconnect adaptive lithography process disclosed in U.S. Pat. No. 4,835,704. Connecting dielectric layer 40 and electrical conducting interconnects 42 of FIG. 7b can easily be removed to facilitate replacement or rework of a last chip using the method disclosed in U.S. Pat. No. 4,878,991 for such removal.

Last chip 16a or 16b may alternatively be connected by conventional wire bonding (not shown). For the type of wire bonding known as nail head bonding, the preferred method involves flaming a microwire of about one mil until the end of the wire is formed into a ball bond of about three mil which may be applied to the chip pad or metal interconnect using standard wire bonding methods such as wedge bonds or ultrasonic vibration or compression.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An integrated circuit package, comprising:
    a substrate having a surface with a chip pocket formed therein through said surface;
    a first chip including interconnection pads, disposed in said pocket;
    a plurality of dielectric layers located on said substrate surface and containing a chip well formed therein completely through all of said plurality of dielectric layers;
    a plurality of electrically-conducting interconnects disposed on at least one of said plurality of dielectric layers and contacting at least one of said interconnection pads of said first chip;
    a last chip including interconnection pads, disposed in said chip well; and flexible interconnection means for flexibly connecting each of at least one of said interconnection pads of said last chip with each of at least one associated one of said plurality of electrically-conducting interconnects in a circuit.

2. The integrated circuit package of claim 1, wherein said chip well extends into said substrate.

3. The integrated circuit package of claim 1, wherein said flexible interconnection means comprises:
a connecting dielectric layer overlaying said last chip and said plurality of dielectric layers, said connecting dielectric layer having a plurality of conducting vias therein, one of said plurality of conducting vias contacting said one of said interconnection pads of said last chip and a second one of said plurality of conducting vias contacting said one of said plurality of electrical conducting interconnects; and
a connecting electrical conductor on said connecting dielectric layer extending between at least two conducting vias which thereby electrically connects said one of said interconnection pads of said last chip with said one of said plurality of electrical conducting interconnects in said circuit.

4. The integrated circuit package of claim 1, wherein an air gap is formed between the dielectric layers in which said chip well is formed and the last chip disposed within said chip well, and said flexible interconnection means comprises a flexible interconnect structure bridging said air gap.

5. The integrated circuit package of claim 4, wherein said flexible interconnect structure comprises a tape automated bond.

6. The integrated circuit package of claim 4, wherein said flexible interconnect structure comprises:
an insulating layer;
a ground plane located below said insulating layer; and
a strip of electrical conductor on top of said insulating layer in order to connect said last chip to said one of said plurality of electrical conducting interconnects.

7. The integrated circuit package of claim 6, wherein said flexible interconnect structure further comprises:
a second insulating layer on top of said strip and said insulating layer;
a second ground plane located on top of said second insulating layer; and
means connecting said ground plane to said second ground plane.

8. The integrated circuit package of claim 6, wherein said flexible interconnect structure further comprises a second ground plane located on top of said insulating layer and means connecting said ground plane to said second ground plane.

* * * * *